(12) United States Patent
Om (10) Patent No.: US 7,565,481 B1
(45) Date of Patent: Jul. 21, 2009

(54) CONTENT ADDRESSABLE MEMORY (CAM) DEVICE AND METHOD FOR FLEXIBLE SUPPRESSION OF HIT INDICATIONS

(75) Inventor: Hari Om, Santa Clara, CA (US)

(73) Assignee: Netlogic Microsystems, Inc., Mountain View, CA (US)

( * ) Notice: Subject to any disclaimer, the term of this patent is extended or adjusted under 35 U.S.C. 154(b) by 340 days.

(21) Appl. No.: 10/977,516

(22) Filed: Oct. 29, 2004

(51) Int. Cl.
*G06F 12/00* (2006.01)
*G06F 13/00* (2006.01)
*G11C 15/00* (2006.01)

(52) U.S. Cl. .............. 711/108; 711/101; 365/49.1; 365/49.17; 365/49.18

(58) Field of Classification Search .................. 711/108
See application file for complete search history.

(56) References Cited

U.S. PATENT DOCUMENTS

| | | | |
|---|---|---|---|
| 5,440,715 A | 8/1995 | Wyland | |
| 5,649,149 A | 7/1997 | Stormon et al. | |
| 6,101,573 A | 8/2000 | Middleton et al. | |
| 6,108,747 A * | 8/2000 | Kaganoi | 711/108 |
| 6,191,970 B1 | 2/2001 | Pereira | |
| 6,195,277 B1 * | 2/2001 | Sywyk et al. | 365/49 |
| 6,199,140 B1 * | 3/2001 | Srinivasan et al. | 711/108 |
| 6,233,646 B1 * | 5/2001 | Hahm | 711/2 |
| 6,240,000 B1 | 5/2001 | Sywyk et al. | |
| 6,381,673 B1 * | 4/2002 | Srinivasan et al. | 711/108 |
| 6,535,951 B1 | 3/2003 | Ross | |
| 6,609,222 B1 * | 8/2003 | Gupta et al. | 714/733 |
| 6,647,457 B1 * | 11/2003 | Sywyk et al. | 711/108 |
| 6,845,024 B1 * | 1/2005 | Wanzakhade et al. | 365/49 |
| 7,111,123 B1 * | 9/2006 | Zou | 711/118 |
| 7,117,300 B1 * | 10/2006 | James et al. | 711/108 |
| 2002/0080638 A1 * | 6/2002 | Hata | 365/49 |
| 2005/0027931 A1 * | 2/2005 | Joshi | 711/108 |

OTHER PUBLICATIONS

Ganssle et al., "Embedded Systems Dictionary," 2003, CMP Books, pp. 36-37.*
"The American Heritage College Dictionary", 2002, Houghton Mifflin Company, 4th ed., pp. 687, 804-805.*
U.S. Appl. No. 10/940,129, Narum et al.
U.S. Appl. No. 10/746,899, Om et al.
U.S. Appl. No. 10/281,814, James et al.
U.S. Appl. No. 10/271,660, James et al.
U.S. Appl. No. 10/264,667, James et al.
U.S. Appl. No. 10/202,526, Zou, Janet.

* cited by examiner

*Primary Examiner*—Pierre-Michel Bataille
*Assistant Examiner*—Michael C Krofcheck
(74) *Attorney, Agent, or Firm*—Haverstock & Owens, LLP (57) ABSTRACT

A content addressable memory (CAM) device (200) can provide for suppression of hit indications. Prioritized match indications (212) can be applied in parallel to both an encoding read-only-memory (ROM) (204-1) and suppression data store (206). A suppression data store (206) can output suppression bits (SH0 and SH1) that correspond to each CAM entry. Hit indications can be selectively suppressed according the values of suppression bits (SH0 and SH1). Hit suppression methods for a CAM device are also disclosed.

21 Claims, 7 Drawing Sheets

CONTENT ADDRESSABLE MEMORY (CAM) DEVICE AND METHOD FOR FLEXIBLE SUPPRESSION OF HIT INDICATIONS

TECHNICAL FIELD

The present invention relates generally to content addressable memory (CAM) devices, and more particularly to circuits that generate hit indications in CAM devices.

BACKGROUND OF THE INVENTION

Content addressable memory (CAM) devices, sometimes also referred to as "associative memories", can provide rapid matching functions between an applied data value (e.g., a comparand, compare data, or search key) and stored data values (e.g., entries). Such rapid matching functions are often utilized in routers, network switches, and the like, to process network packets. As but two examples, a CAM can be utilized to search access control lists (ACLs) or forwarding information bases (FIBs). As is well know, an ACL can include a set of rules (data set) that can limit access (e.g., forwarding of packets) to only those packets having fields falling within a particular range. A FIB can include data necessary for forwarding a packet, typically the generation of a "next hop" address in response to a destination address.

A typical CAM device can store a number of data values in a CAM cell array. In a compare (i.e., search) operation, entries can be compared to a compare data value. An entry that matches the compare data value can result in the generation of a HIT indication. In addition, a typical CAM device can also include prioritization of HIT results. That is, if multiple entries match a given compare data value (multiple match case), one entry can be selected as a "winning" entry according to predetermined criteria. In many cases, an entry having the lowest address is selected as the winning entry in a multiple match case.

Conventionally, a CAM device may be divided into multiple CAM blocks, each of which can include its own prioritization circuitry. Such a division can be advantageous in power management and table management of the device.

Basic CAM device operations can include simple lookup operations, followed by single entry writes and/or reads. However, more sophisticated applications can involve more complex operations. For example, in more complex table management schemes, it may be desirable to invalidate (i.e., block) all entries beyond a particular physical address.

One example of a CAM device is shown in U.S. Pat. No. 6,240,000 issued to Sywyk et al. on May 29, 2001. This patent shows how a comparand value can be sequentially compared to different CAM blocks within different portions of a single clock cycle to reduce peak transient currents. Sywyk et al. also shows embodiments that receive portions of a comparand as input values, and combine search results from such portion to give an overall match result for a comparand larger than a received input value.

Commonly owned co-pending U.S. patent application Ser. No. 10/746,899 titled STAGGERED COMPARE ARCHITECTURE FOR CONTENT ADDRESSABLE MEMORY (CAM) DEVICE by Om et al. now U.S. Pat. No. 6,958,925 B1, issued on Oct. 25, 2005, discloses a CAM device that can split a compare data value into multiple portions for comparison on subsequent clock cycles. The contents of this patent application are incorporated by reference herein.

To better understand various features of the disclosed embodiments, other conventional approached to accommodating table update functions will now be described.

Figure 8:
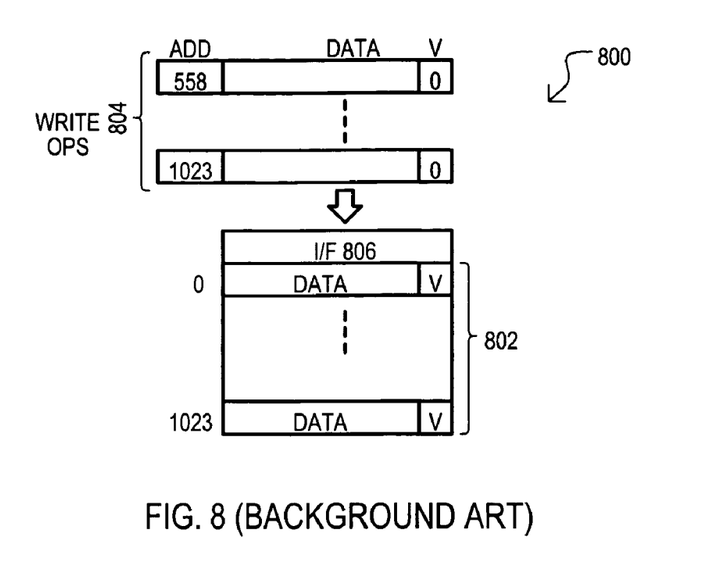
FIG. 8 is a block diagram showing a first conventional approach to invalidating entries in a CAM device.

A first conventional approach to invalidating entries beyond a certain range is set forth in FIG. 8. FIG. 8 shows a conventional CAM device 800 having an array 802 with 1024 CAM entries having physical addresses from 0 to 1023. Data can be written to such entries via an interface 806. Each entry includes bit locations for storing a data value DATA. In addition, each entry also includes a bit location for storing a valid bit V. If a valid bit is set in an entry (in this example is a "1"), the entry can generate a match (hit) indication if the corresponding search key value matches the stored data value DATA. However, if a valid bit is not set (in this example is a "0"), the entry generates a mismatch (MISS) regardless of a given search key value.

FIG. 8 illustrates an operation that seeks to block those entries having a physical address greater than "557". In the example shown, a sequence of write operations 804 can be executed, to clear the valid bits of entries at addresses 558 to 1023.

While such an approach can accomplish the given task, the large number of write operations needed can be time consuming and cumbersome to execute. Additionally, in some implementations, such operations can overwrite existing data, thus preventing such data values from being used at a later point in time. Still further, in order to "unblock" the entries, the same number of writes will be needed to set a valid bit in each entry.

Figure 9:
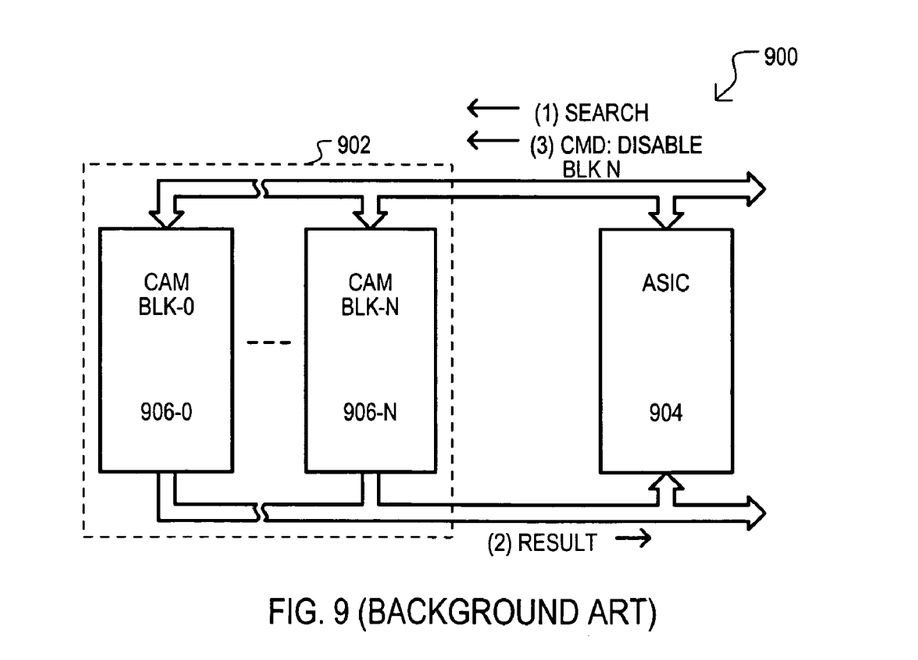
FIG. 9 is a block diagram showing a second conventional approach to invalidating entries in a CAM device.

A second conventional approach to block entries within a certain range is set forth in FIG. 9. FIG. 9 shows a system 900 having a CAM device 902 and an application specific integrated circuit (ASIC) 904 designed to execute predetermined search and related operations. A CAM device 902 can include a number of different CAM blocks 906-0 to 906-N, each of which can be selectively disabled by a command from ASIC 904.

In the system of FIG. 9, certain ranges of entries can be excluded with an iterative process. As shown in the figure, a search command can be received by CAM device 902 (1), resulting in the generation of a search result (2) from CAM block 906-N. In response to such a search result, ASIC 904 can write a command back into CAM device 902 that disables CAM block 906-N.

A drawback to the arrangement of FIG. 9 can be response time, complexity of the resulting system, and lack of "granularity" in entry organization. In particular, commands must make a loop from the CAM device 902 to the ASIC 904, and then from the ASIC 904 back to the CAM device 902. This can increase response time. Added complexity arises from the programming/design needed in the ASIC 904 to execute the indicated commands. Finally, a CAM device 902 can be disabled only a block at a time. Thus, when tables are blocked with the above method, only one table may be stored in any given CAM block (906-0 to 906-N).

In light of the above, it would be desirable to arrive at some way of enabling suppression of hit indications in CAM device that is more flexible and/or faster than the above conventional approaches.

SUMMARY OF THE INVENTION

The present invention includes a content addressable memory (CAM) device that includes a priority encoder (PE) circuit that activates a priority output signal on one of a plurality of PE output lines according to a prioritization of match indications generated from CAM entries. One or more bit store circuits can be connected to each PE output, and have outputs connected to a suppression output line. A result control circuit can suppress a match indication result value from the PE circuit based on a suppression value provided on the suppression output line.

In such an arrangement, hit suppression can be provided based on storage circuits accessed after a priority encoder with respect to a signal flow. Such an arrangement can allow for rapid generation of hit suppression values and/or easy incorporation of hit suppression capabilities into existing CAM device designs.

According to another aspect of the embodiments, the plurality of CAM entries includes at least a first set of CAM entries and a second set of CAM entries. In addition, a suppression store circuit can include a first suppression data store that stores at least one suppression bit value corresponding to each entry in the first set of entries, and a second suppression data store, formed separately from the first suppression data store, that stores at least one suppression bit value corresponding to each entry in the second set of entries.

In this way, suppression data can be provided for CAM devices having a division of CAM entries into one or more logical groups.

According to another aspect of the embodiments, the plurality of CAM entries includes a first CAM array having a plurality of first match lines, and a second CAM array having a plurality of second match lines. In addition, a result combination circuit can combine match indications from first match lines with match indications from corresponding second match lines to generate combination match indications. A PE circuit can prioritize combination match indications and includes one PE output line corresponding to each combination match indication.

In this way, hit suppression can be incorporated into CAM devices that logically combine match indications with one another.

According to another aspect of the embodiments, a PE circuit can include a read-only-memory (ROM) having a plurality of entries, each entry being addressed according to a corresponding PE output line.

In such an arrangement, a ROM and suppression store can be accessed in parallel, allowing for rapid generation of suppression bit data.

According to another aspect of the embodiments, each bit storage circuit is accessible by an address of a CAM entry corresponding to the bit storage circuit. In this way, setting of suppression data can be easily accomplished.

According to one aspect of the embodiments, a result control circuit can receive result values from a PE circuit and a suppression bit from a suppression store circuit. The result control circuit can output a HIT result value if the suppression bit has one value and can output a MISS result value if the suppression bit has another value.

The present invention can also include a CAM device having a suppression control circuit that receives a search result value and suppression data as inputs. The suppression control circuit can output a search result when the suppression data has one value, and outputs a predetermined search result when the suppression data has another value. In addition, a priority encoder section can generate the search result value representing a winning CAM entry from a search operation. A suppression data store can store a plurality of suppression bits, each corresponding to at least one CAM entry. One or more suppression bits corresponding to the matching CAM entry can be output as the suppression data.

In this way, hit suppression data can be generated in response to outputs from a priority encoder, as opposed to conventional arrangements that might utilize a valid bit within a CAM array. Such an arrangement can allow for more flexibility in suppressing hit indications.

According to another aspect of the embodiments, a CAM device can further include a first CAM array with a first group of CAM entries and a second CAM array with a second group of CAM entries. A suppression data store can have a first block that stores at least one suppression bit corresponding to each CAM entry of the first group of CAM entries, and a second block that stores at least one suppression bit corresponding to each CAM entry of the second group of CAM entries. In one particular case, the first group of CAM entries has even physical addresses, and the second group of CAM entries has odd physical addresses.

According to one aspect of the embodiments, a CAM device can include a plurality of CAM entries, a priority encoder and a read-only-memory (ROM). The priority encoder has output lines for each CAM entry, and the ROM has one location accessed according to each priority encoder output line. In addition, a bit from the suppression data store can be accessed according to each priority encoder output line.

In this way, suppression data and ROM data can be accessed essentially simultaneously with priority encoder output lines.

The present invention may also include a method of suppressing hit indications in a CAM device. The method can include storing a hit suppression value for each entry of a CAM device, prioritizing hit indications generated from a search operation to generate prioritized search results, accessing the hit suppression values with the prioritized search results.

Such a method is in contrast to conventional arrangements that may access valid bit data with non-prioritized signals (e.g., entry address value) and/or may disable an entire block with a disable command.

According to another aspect of the embodiments, CAM entries can be formed within a CAM memory cell array. Further, the step of storing a hit suppression value for each entry of a CAM device includes storing hit suppression values in register circuits separate from the CAM memory cell array.

In this way, hit indications may be suppressed by accessing one or more selected registers, rather than an entire CAM entry.

According to another aspect of the embodiments, a method can also include suppressing a hit indication in response to predetermined hit suppression values.

According to another aspect of the embodiments, a method can also include accessing a read only memory (ROM) with the prioritized search results in parallel with the hit suppression values to generate a hit address value for a hit indication.

According to another aspect of the embodiments, a method can also include suppressing a hit indication in response to predetermined hit suppression value in combination with at least one bit value of the hit address.

According to another aspect of the embodiments, the step of accessing the hit suppression values with the prioritized search results can include accessing a first set of hit suppression values with a first set of prioritized search results, and accessing a second set of hit suppression values with a second set of prioritized search results.

According to another aspect of the embodiments, the method can also include logically combining at least two hit indications together prior to prioritizing such hit indications.

DETAILED DESCRIPTION

Various embodiments of the present invention will now be described in detail with reference to a number of drawings. The embodiments include a content addressable memory (CAM) device and operating method that can flexibly suppress hit indications with a less complex arrangement, and faster speeds than conventional approaches.

Figure 1:
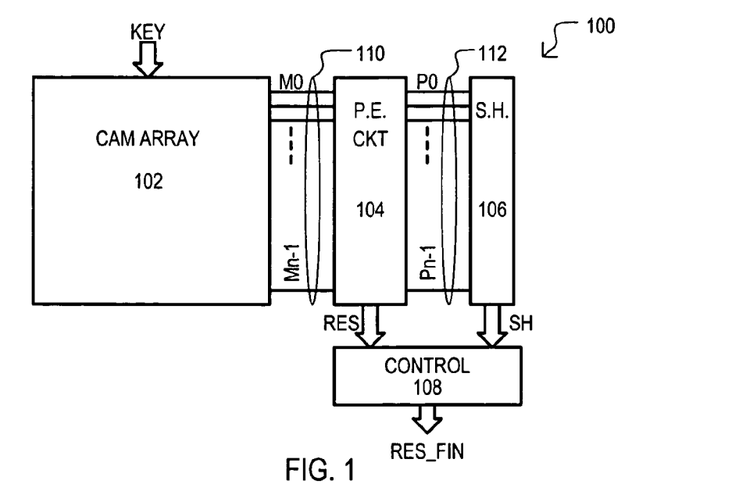
FIG. 1 is a block schematic diagram of a first embodiment of the present invention.

Referring now to FIG. 1, a CAM device according to a first embodiment is set forth in a block schematic diagram and designated by the general reference character 100. A CAM device 100 can include a CAM cell array 102, a priority encoder section 104, a suppression data store 106, and a control circuit 108. A CAM cell array 102 can have a number of CAM entries that can compare stored data values with an applied key KEY in a search operation. Each entry can provide match indications (M0 to Mn−1) on corresponding match lines 110. As but one example, each entry can include a row of CAM cells commonly connected to a match line.

A priority encoder circuit 104 can prioritize generated match indications M0 to Mn−1 according to predetermined criteria to activate one priority encoder output signal P0 to Pn−1. Such a single activated signal can be considered to correspond to a "winning" CAM entry. Priority encoder output signals (P0 to Pn−1) can be provided on corresponding priority encoder output lines 112. In one arrangement, a priority encoder circuit 104 can prioritize match indications according to a lowest physical address of an entry generating a match indication, and provide such an entry address as a result RES.

A suppression data store 106 can store suppression bit values that can be used to suppress hit indications for a given CAM entry. A suppression data store 106 can include a number of storage elements that store one or more suppression bits corresponding to each entry of CAM array 102. In response to HIT indications, suppression data store 106 can provide a suppression value SH to control circuit 108.

Further, and unlike conventional arrangements, the suppression bits in suppression data store 106 can be accessed by priority encoder output signals (P0 to Pn−1). Thus, if a highest priority HIT indication is generated on match line M8, priority encoder output signal P8 will access one or more suppression bits stored within suppression data store 106.

A control circuit 108 can receive a result value RES from priority encoder circuit 104 as well as suppression value SH from suppression data store 106. In response to such values, a control circuit 108 can selectively suppress a hit indication to generate a final result value RES_FIN. More particularly, if a suppression value SH is set to a "suppress" value, a control circuit 108 can output a "miss" result value (any HIT result is suppressed), regardless of whether a result value RES indicates a HIT or not. In contrast, if control circuit 108 receives a result value RES indicating a HIT, and a corresponding suppression value SH is not set to a "suppress" value, a control circuit 108 can output the HIT result value as a final result value RES_FIN.

In this way, a CAM device 100 can selectively suppress hit indications according to stored suppression bits corresponding to each CAM entry.

A second embodiment of the present invention will now be described with reference to FIG. 2A.

Figure 2A:
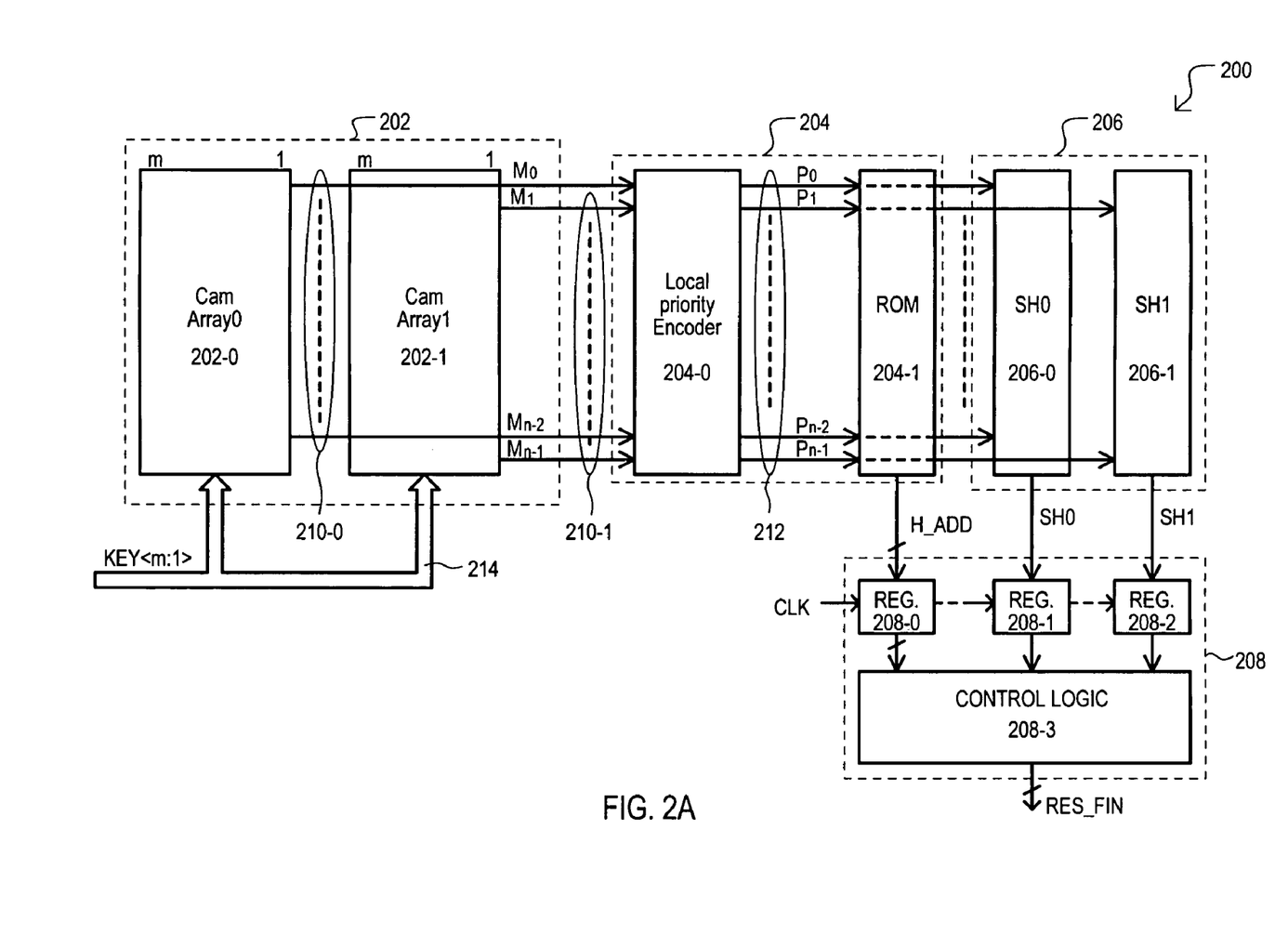
FIG. 2A is block schematic diagram of a second embodiment of the present invention.

FIG. 2A is a schematic diagram of a CAM device 200 that includes some of the same general components as FIG. 1. Accordingly, like component will be referred to by the same reference character but with the first digit being a "2" instead of a "1".

In the arrangement of FIG. 2A, a memory cell array 202 can include a first CAM array 202-0 and a second CAM array 202-1, each of which contains a number of CAM entries. In the very particular example of FIG. 2A, both first and second CAM arrays (202-0 and 202-1) can include "n/2" CAM entries total, each of which can generate a match indication on a corresponding match line (M0 to Mn−1). Further, CAM entries in a first CAM array 202-0 can correspond to even physical addresses, and thus possess address having a least significant bit of "0". CAM entries in a second CAM array 202-1 can correspond to odd physical addresses, and thus possess address having a least significant bit of "1".

In a search operation, entries in first CAM array 202-0 can provide "even" match indications (M0, M2 . . . Mn−2) on a first set of match lines 210-0. Entries in second CAM array 202-1 can provide "odd" match indications (M1, M3 . . . Mn−1) on a second set of match lines 210-1.

In the example of FIG. 2A, search keys of size "m" bits can be applied to each CAM array 202-0 and 202-1, on a search key bus 214.

In FIG. 2A, a priority encoder section 204 can include a local priority encoder (PE) 204-0 and a read-only-memory (ROM) 204-1. Local PE 204-0 can receive both sets of match indications (M0 to Mn−1), and prioritize such indications. In the very particular example of FIG. 2A, it is assumed that local PE 204-0 prioritizes indications based on the lowest address of the corresponding CAM array entry. Local PE 204-0 provides prioritized signals P0 to Pn−1 on PE output lines 212. It is understood that prioritized signals (P0 to Pn−1) are "one-hot" encoded, with only one signal being active when a search generates one or more HITs. Further, prioritized signals P0 to Pn−1 can correspond to match indications M0 to Mn−1, respectively.

In response to an active prioritized signal (P0 to Pn−1), a ROM 204-1 can output a hit address H_ADD. A hit address H_ADD can be a multi-bit value unique to each entry (and hence each match line). More particularly, a hit address H_ADD can be the physical address of a highest priority matching entry.

As in the case of FIG. 1, prioritized signals (P0 to Pn−1) can also be provided to suppression data store 206. However, in the particular arrangement of FIG. 2A, even prioritized signals (P0, P2 ... Pn−2) can be applied to a first block 206-0, while odd prioritized signals (P1, P3 ... Pn−1) can be applied to a second block 206-1. Thus, first block 206-0 can store suppression data for CAM array 202-0 and second block 206-1 can store suppression data for CAM array 202-1.

In the very particular embodiment of FIG. 2A, first block 206-0 stores one suppression bit for each entry of CAM array 202-0 (i.e., each entry with an even numbered physical address). Each such bit value can be selected by a corresponding even prioritized signal (P0, P2 ... Pn−2), and output as suppression bit value SH0. Similarly, second block 206-1 stores one suppression bit for each entry of CAM array 202-1 (i.e., each entry with an odd numbered physical address). Each bit value of second block 206-1 can be selected by a corresponding odd prioritized signal (P1, P3 ... Pn−1), and output as suppression bit value SH1.

A control circuit 208 can include an address register 208-0, a first suppression bit register 208-1, a second suppression bit register 208-2, and control logic 208-3. An address register 208-0 can store a hit address H_ADD received from a ROM 204-1. First and second suppression bit registers (208-1 and 208-2) can store suppression bit values SH0 and SH1, respectively.

In the example shown, registers 208-0 to 208-2 can be controlled according to a clock signal CLK.

Control logic 208-3 can receive values stored in registers 208-0 to 208-2, and in response thereto, output a final result RES_FIN. More particularly, depending upon the values of suppression bits (SH0 and/or SH1), a control circuit can output either a HIT result or a MISS result as a final result RES_FIN. Even more particularly, a control logic 208-3 can operate according to the following logic:

(If LSB=0 && SH0=1) OR (if LSB=1 && SH1=1),
then HIT result suppressed (RES_FIN=MISS)

where LSB is the least significant bit of a hit address H_ADD.

Having described the components of a CAM device according to a second embodiment, the operation of the second embodiment will now be described with reference to FIGS. 2A and 2B.

Figure 2B:
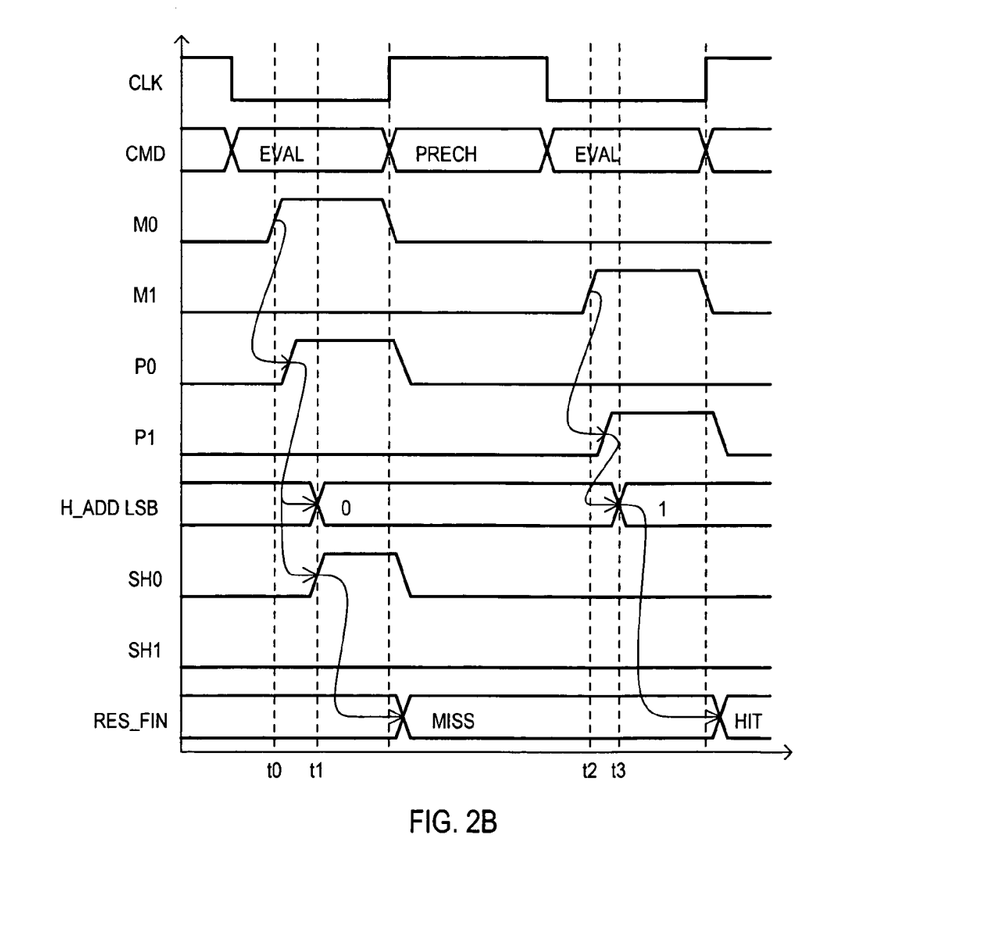
FIG. 2B is a timing diagram showing the operation of the embodiment of FIG. 2A.

FIG. 2B is a timing diagram showing the operation of a CAM device 200. FIG. 2B includes a waveform CLK that represents a clock signal, waveform CMD that represents a command being executed by CAM device 200, waveforms for match signals M0 and M1, waveforms for prioritized signals P0 and P1, a least significant bit of a hit address H_ADD LSB, waveforms for suppression bits SH0 and SH1, and a waveform for a final result RES_FIN.

At about time t0, a first evaluation operation begins. As is well understood by those skilled in the art, such an operation can include the application of a search key to CAM arrays 202-0 and 202-1. In the particular example shown, a highest priority matching entry is at physical address 0, resulting in match indication M0 generating a HIT indication (going high in this very particular example). It is assumed that local priority encoder 204-0 prioritizes match indications according to lowest physical address, thus prioritized signal P0 is activated (goes high in this example).

At about time t1, in response to an active prioritized signal P0, ROM 204-1 can output a hit address of 0 (i.e., binary 000000000, assuming 512 entries per CAM array). Thus, the least significant bit of this address H_ADD LSB can be "0". At the same essential time, and in response to the same prioritized signal P0, first block 206-0 can output a suppression bit SH0 corresponding to (physical address) entry 0. In this particular example, the SH0 bit value is active (in this case high), thus indicating the hit result should be suppressed.

Shortly after time t1, control logic 208-3 can output a final result value of MISS, in response to the H_ADD LSB of "0" and set suppression bit value SH0=1.

Referring still to FIG. 2B, at about time t2, a second evaluation operation begins. In the particular example shown, a highest priority matching entry is at physical address 1, resulting in match indication M1 generating a HIT indication. Prioritized signal P1 is activated.

At about time t3, in response to an active prioritized signal P1, ROM 204-1 can output a hit address of 1 (i.e., binary 000000001) and a least significant bit of this address H_ADD LSB will be "1". At the same essential time, and in response to the same prioritized signal P1, second first block 206-1 can output a suppression bit SH1 corresponding to entry 1. In this particular example, the SH1 bit value is not active (in this case low), thus the hit result is not suppressed.

In this way, a hit indication generated by a CAM array can be suppressed or not suppressed according to bit values accessed by a priority encoder.

A third embodiment of the present invention will now be described with reference to FIG. 3A.

Figure 3A:
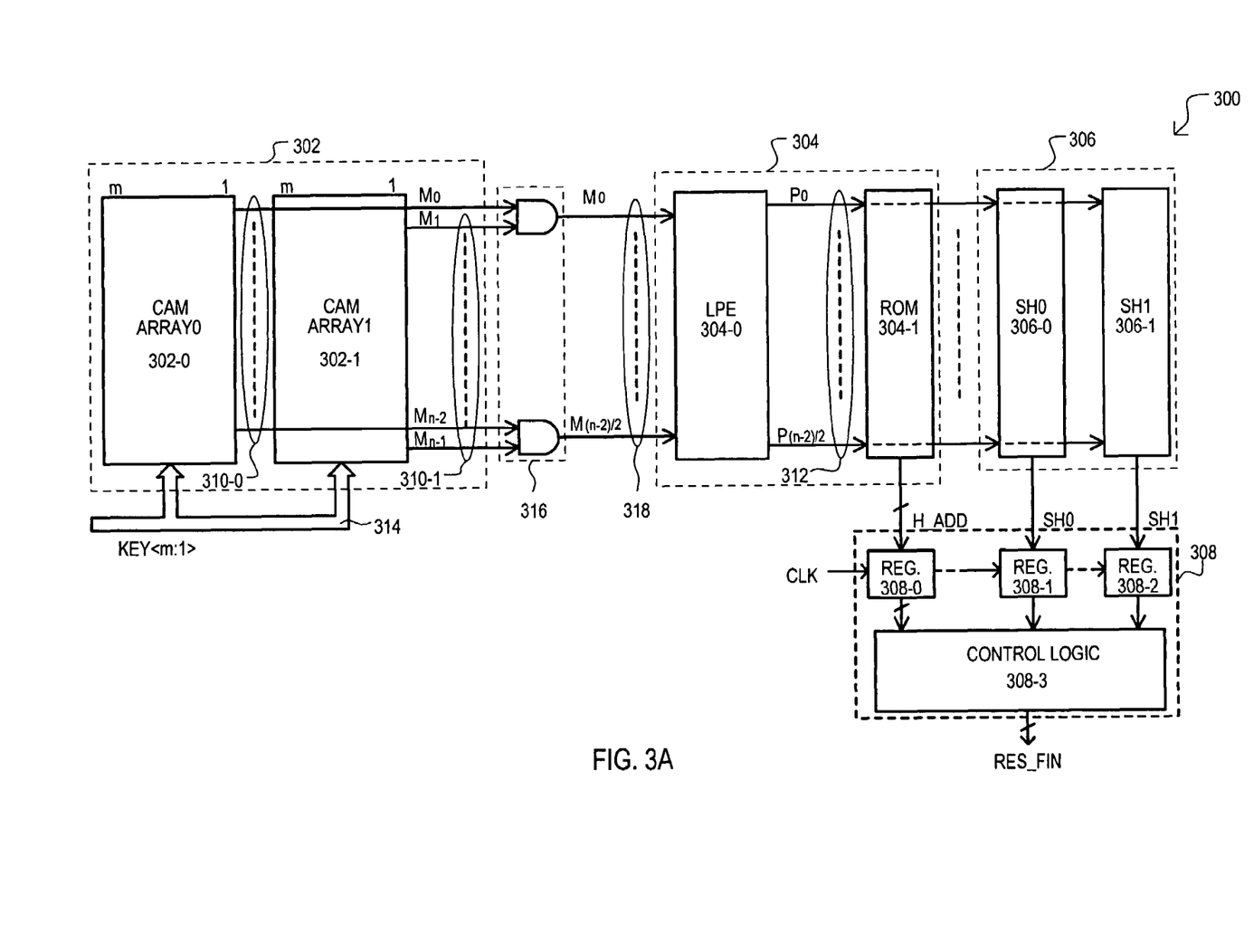
FIG. 3A is a block schematic diagram of a third embodiment of the present invention.

FIG. 3A is a schematic diagram of a CAM device 300 that includes similar components as FIG. 2. Accordingly, like components will be referred to by the same reference character but with the first digit being a "3" instead of a "2".

A CAM device 300 can differ from that of FIG. 2A in that match results from different CAM arrays 302-0 and 302-1 can be logically combined to generate a result for a wider word than native word size (more than "m" bits, in this example). In the very particular example of FIG. 3A, a logic circuit 316 can logically combine one match line from each CAM array 302-0 to generate combined match results (M0 to M(n−2)/2) on combined result lines 318. As a result, the number of combined results values is n/2.

In this way, a CAM device 300 can provide suppression for matches based on data words having a greater size than a native word for the device (a native word being the width of data values applied to inputs of the CAM device).

A local priority encoder 304-0 and ROM 304-1 can operate in the same general fashion as the second embodiment. It is understood, however, that local priority encoder 304-0 outputs n/2 prioritized output signals (P0 to P(n−2)/2). Similarly, ROM 304-1 can output addresses from 0 to n/2.

CAM device 300 can also differ from that of FIG. 2A in that each prioritized signals (P0 to P(n−2)/2) can be applied to multiple suppression bit blocks. In the particular example of FIG. 3A, each prioritized signal (P0 to P(n−2)/2) can be applied to both blocks 306-0 and 306-1. Thus, suppression of a given HIT indication can be based on more than one suppression bit value.

It is understood that the arrangement of FIG. 3A can provide great flexibility in meeting different types of search operations. More particularly, HIT results may be generated (or suppressed) based on different portions of a search key (i.e., most significant portion from CAM array 302-0 or least significant portion from CAM array 302-1), a suppression bit value SH0, SH1 or both SH0 and SH1.

In this way, a CAM device 300 can provide multiple, flexible approaches for suppressing HIT indications.

Having described the components of a CAM device according to the third embodiment, the operation of the third embodiment will now be described with reference to FIGS. 3A and 3B.

Figure 3B:
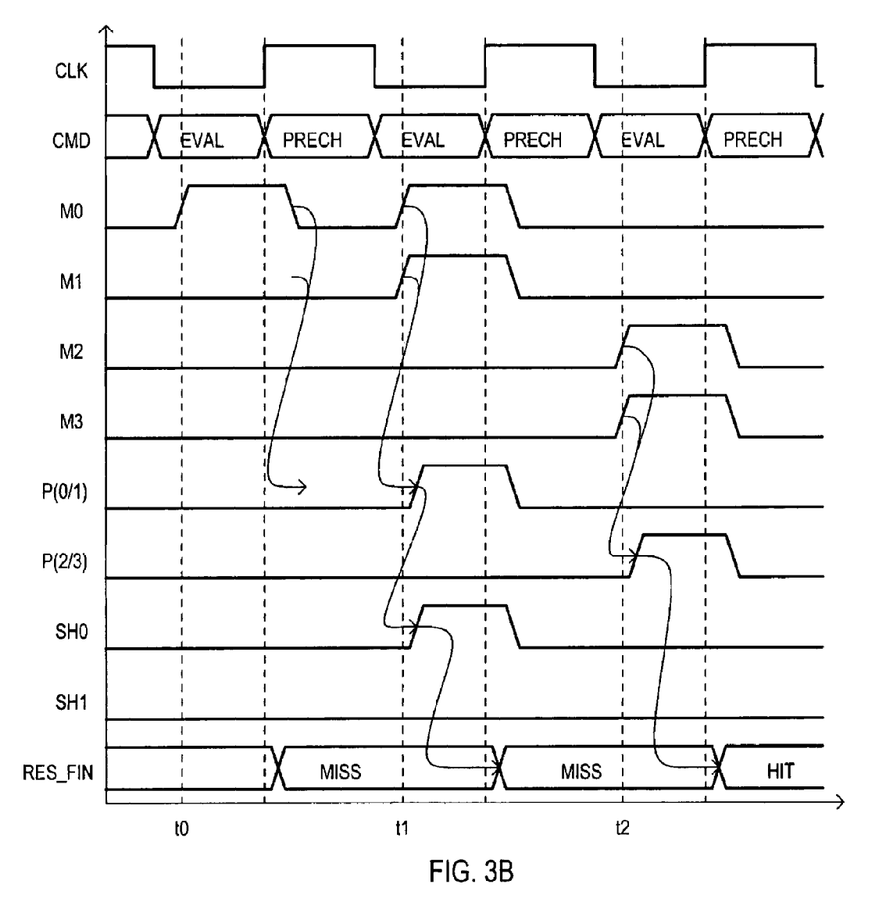
FIG. 3B is a timing diagram showing the operation of the embodiment of FIG. 3A.

FIG. 3B is a timing diagram showing the operation of a CAM device 300. FIG. 3B includes the same waveforms as FIG. 2B. However, FIG. 3B shows two additional match indications M2 and M3, and two prioritized values P(0/1) and P(2/3). Prioritized value P(0/1) represents a logical combination of match indications M0 and M1. Prioritized value P(2/3) represents a logical combination of match indications M2 and M3.

In the operations illustrated by FIG. 3B, it is assumed that HIT indications are suppressed according to a logical ORing of suppression bit values SH0 and SH1. Thus, FIG. 3B does not include a hit address waveform. However, it is understood that a control circuit 308-3 can suppress HIT indications based on one or more bit values of a hit address, as illustrated in FIG. 2B.

At about time t0, a first evaluate operation begins. A first CAM array 302-0 can activate one match indication M0. However, a corresponding match indication M1 from second CAM array 302-1 can remain inactive. Because match indication M1 remains inactive, by operation of an AND gate within logic circuit 316, combined match result M(0/1) remains inactive. Thus, prioritized values P(0/1) can remain inactive.

Thus, this first search illustrates how a HIT can be suppressed according to one portion of a search word.

At about time t1, a second evaluate operation begins. In this second search operation, a first CAM array 302-0 can activate match indication M0, and a second CAM array 302-1 can activate a corresponding match indication M1. By operation of an AND gate within logic circuit 316, combined match result M(0/1) can be activated.

In response to combined match result M(0/1), local priority encoder 304-0 can activate prioritized value P(0/1). Prioritized value P(0/1) can be applied to block 306-0 and 306-1. In the example shown, block 306-0 can output an active suppression bit value SH0, while block 306-1 can output an inactive suppression bit SH1.

It is assumed in for the example of FIG. 3B, that a HIT indication can be suppressed when either suppression bit value (SH0 or SH1) is active. Thus, a HIT indication is suppressed and a final result RES_FIN indicates a MISS.

At about time t2, a third evaluation operation begins. In this third operation, a first CAM array 302-0 can activate match indication M2, and a second CAM array 302-1 can activate a corresponding match indication M3. By operation of an AND gate within logic circuit 316, combined match result M(2/3) can be activated.

In response to combined match result M(2/3), local priority encoder 304-0 can activate prioritized value P(2/3). However, in response to such a value, blocks 306-0 and 306-1 can both output an inactive suppression bit value (i.e., SH0=SH1=0). As a result, the hit indication is not suppressed, and a final result value indicates a HIT.

Figure 4:
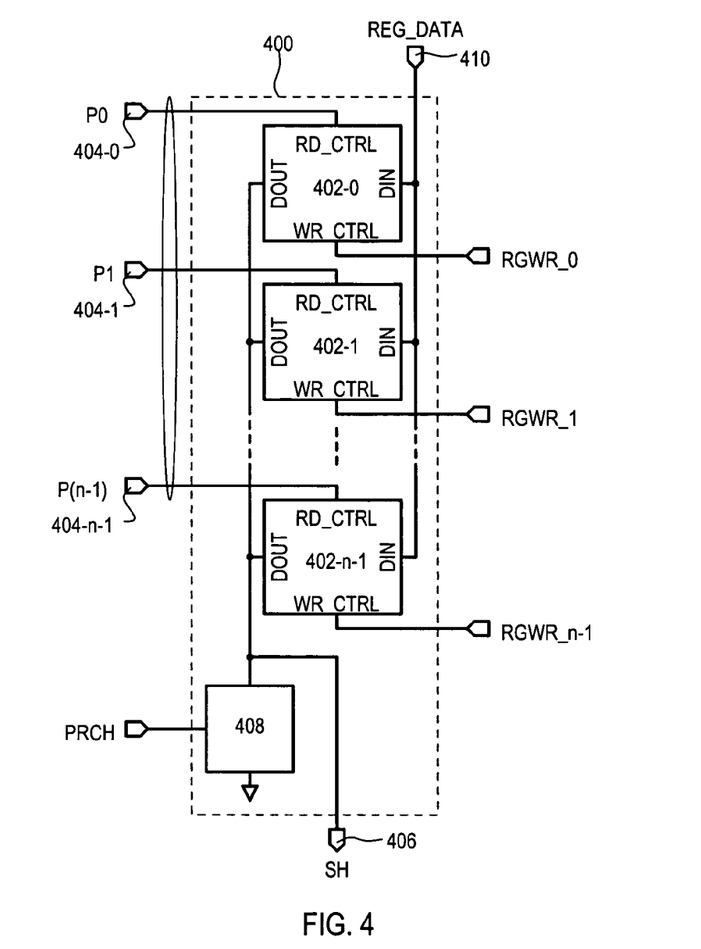
FIG. 4 is a block schematic diagram of a suppression bit block according to one embodiment.

Referring now to FIG. 4, one example of a block for storing suppression data is set forth in a block schematic diagram and designated by the general reference character 400. A block 400 can include a number of bit storage locations 402-0 to 402-(n−1), prioritized value inputs 404-0 to 404-(n−1), a suppression value output 406, and a precharge circuit 408.

Each bit storage location (402-0 to 402-(n−1)) can store a suppression bit value. Such a bit value can be provided at a data output DOUT according to a value at a read control input RD_CTRL. In the very particular arrangement of FIG. 4, read control input can receive prioritized signals P0 to Pn−1 received from a priority encoder, or the like. Further, data outputs DOUT of all bit storage locations (402-0 to 402-(n−1)) can be commonly output on suppression value output 406 as suppression value SH.

A precharge circuit 408 can precharge a suppression value SH at the start of a search operation. In the very particular example shown, a precharge circuit 408 can precharge a suppression value SH to ground (e.g., logic "0") according to a precharge signal that is activated following a search operation.

Referring still to FIG. 4, each bit storage location (402-0 to 402-(n−1)) can receive data at a data input DIN according to a value at a write control input WR_CTRL. In the very particular arrangement of FIG. 4, each write control input can receive a register write signal (RGWR_0 to RGWR_n−1). Further, write data REG_DATA can be received at a common register input 410. Register write signals (RGWR_0 to RGWR_n−1) can allow suppression bits to be addressed in the same general fashion as a corresponding CAM entry. Thus, in particular embodiments, register write signals (RGWR_0 to RGWR_n−1) can correspond to word line signals (not shown) for the corresponding entries generated by an address decoder, or the like.

Figure 5:
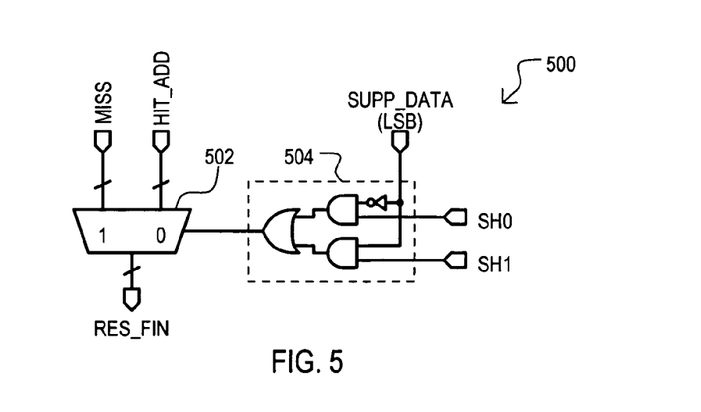
FIG. 5 is a block schematic diagram of hit suppression control logic according to one embodiment.

Referring now to FIG. 5, one very particular example of hit suppression control logic is set forth in a block schematic diagram and designated by the general reference character 500. Control logic 500 could be used as control logic shown as 208-3 in FIG. 2A.

Control logic 500 can include a switch section 502 and decision section 504. A switch section 502 can select between a result value (HIT_ADD) and a miss indication MISS. While FIG. 5 shows a multi-bit hit address HIT_ADD being provided as a result value, it is understood such a value could be single bit value. Similarly, while FIG. 5 shows a multi-bit miss indication MISS, it is understood such a value could also be single bit value.

A decision section 504 can determine whether a hit indication is to be suppressed or not. The very particular example of FIG. 5 shows the logic operation described above with respect to FIG. 2A (utilizing a least significant bit of a hit address). However, one skilled in the art could arrive at various other approaches according to the desired suppression operation.

Accordingly, FIG. 5 represents but very particular example of control logic and should not be construed as limiting to the invention.

Figure 6:
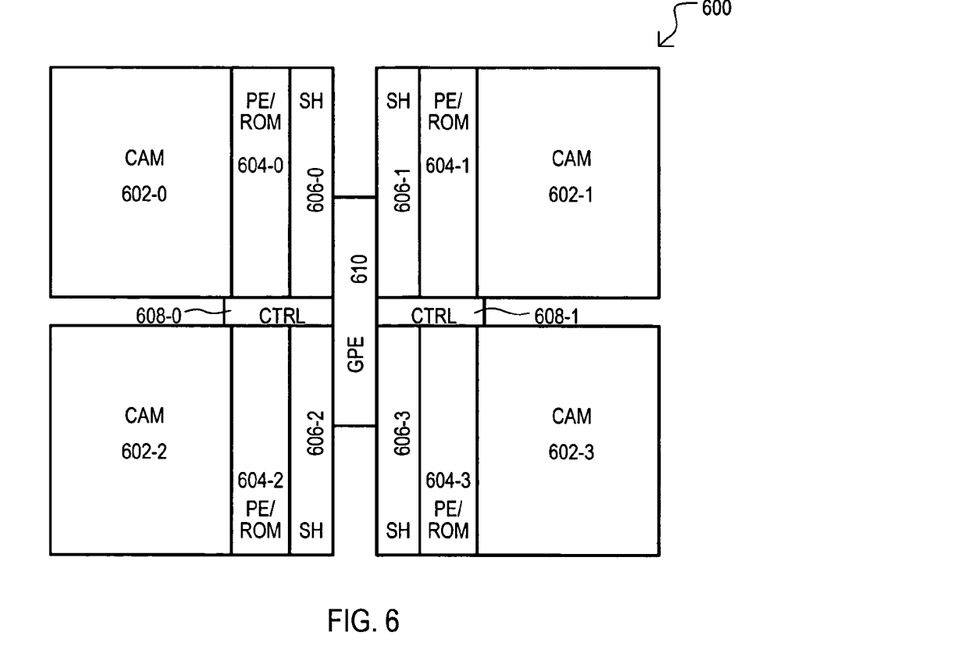
FIG. 6 is a block schematic diagram of a fourth embodiment of the present invention.

Referring now to FIG. 6, a CAM device according to another embodiment, is set forth in a block diagram and designated by the general reference character 600. A CAM device 600 can split a priority encoding function among multiple priority encoders. Thus, CAM device 600 includes multiple CAM arrays 602-0 to 602-3, each with corresponding local priority encoder/ROMs (PE/ROMs) 604-0 to 604-3 and control circuits 608-0 and 608-1.

Suppression data stores 606-0 to 606-3 can be provided for each CAM array 602-0 to 602-3, for supplying suppression data for CAM entries in the CAM arrays according to any of the above approaches and equivalents. Control circuit 608-0 can select between search results generated from local PE/ROMs 604-0 and 604-2, and provide such results to a global priority encoder 610. Similarly, control circuit 608-1 can select between search results generated from local PE/ROMs 604-1 and 604-3, and provide such results to a global priority encoder 610. Control circuits (608-0 and 608-1) can also suppress hit results in response to corresponding suppression data according to any of the above approaches, or equivalents.

In this way, in the event a CAM device splits priority encoding functions among multiple priority encoders, suppression of HIT indications can still be provided by including suppression data stores that have a very simple interaction with priority encoders (e.g., simply receive one-hot encoded prioritized values). Further, interaction between priority encoders is minimal.

Figure 7:
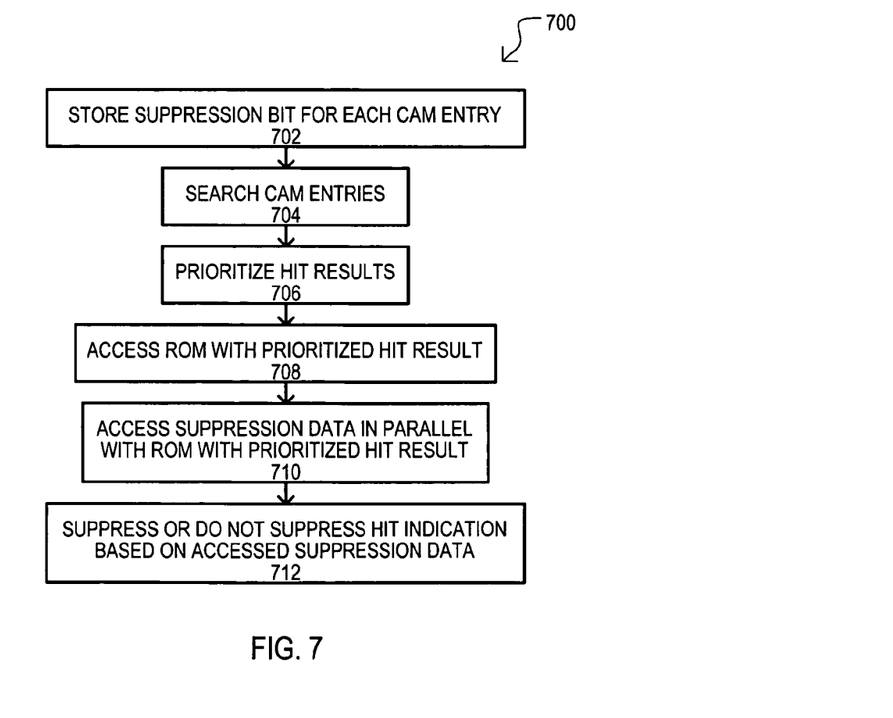
FIG. 7 is a flow diagram showing a method according to one embodiment.

Referring now to FIG. 7, a method according to one embodiment is set forth in flow diagram and designated by the general reference character 700.

A method 700 can include storing a suppression bit value for each CAM entry (step 702). Such a step can include writing one or more suppression bit value for each CAM entry, and if necessary, updating such values while the CAM device is in operation. According to well-understood methods, the CAM entries can be searched (step 704). For example, a search key can be applied to CAM entries, which in turn, can generate HIT or MISS indications.

In the event a search generates one or more HIT results, such HIT results can be prioritized (step 706). As but one example, a HIT result of a lowest physical address can be given priority over any other HIT result. A ROM can then be accessed with a prioritized HIT result (step 708). As but one example, a ROM can output data associated with a priority HIT result, more particularly, can output a lowest physical address corresponding to such a HIT result.

Unlike conventional CAM device methods, a method 700 can also include accessing suppression data in parallel with the ROM according to a priority HIT result (step 710). In addition, a priority HIT result can be suppressed or not suppressed according to such suppression data (step 712).

In this way, a method 700 can suppress a HIT result generated by a CAM device by accessing a suppression bit with a prioritized HIT result.

CAM device and/or method according to the above embodiments can have a number of advantages over conventional arrangements. First, the arrangement provides a way of suppressing hit indications (e.g., block entries) with relatively simple interaction between suppression logic (i.e., control circuit 108 and 308) and a priority encoder. Thus, the arrangement can be easily implemented by modifying existing CAM device designs. This is in contrast to other approaches that may seek to incorporate some sort of circuit within a row and/or column pitch a CAM cell array, which may add considerable area and complexity.

In addition, the above embodiments can provide hit suppression with substantially no decrease in speed, as a ROM look-up and suppression data look-up can occur in parallel.

Further, a CAM device and/or method according to the above embodiments can provide hit suppression with relatively little increase in overall area, as register/latch circuits can be compact in size.

Still further, as noted with respect to the embodiment of FIG. 3A, according to embodiments of the present invention, wider words (search keys having more bits than CAM entry sizes) can be accommodated, with a suppression value from any of the portions (e.g., least significant byte, most significant byte) being used to suppress a hit indication, alone or in combination with one another.

It is understood that final result generated by a CAM device or method according to the present invention may include a simple indication (HIT, MISS) or a more complex set of data, including but not limited to a physical address of a highest priority matching entry or a multiple match indication, as but a few examples.

Further, while the embodiment of FIG. 3A has shown a CAM arrangement in which two match indications can be combined, alternate embodiments can include CAM devices that combine a larger number of match results.

Along these same lines, while the above embodiments have illustrated arrangements in which blocks have stored one bit per CAM entry, it is of course understood that alternate embodiments could provide multiple bits for each entry.

The various embodiments of the present invention can enjoy wide application in various industries. As but one example, CAM devices and methods of the present invention can be utilized in packet processing devices, such as routers and switches, as look up tables for packet forwarding, classification, and the like. In such an application hit indications can be suppressed flexibly and with relative ease.

It is also understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A content addressable memory (CAM) device, comprising:
    a priority encoder (PE) circuit that activates a priority output signal on one of a plurality of PE output lines according to a prioritization of match indications generated from CAM entries;
    at least one suppression store circuit having at least one bit storage circuit coupled to each PE output line, the bit storage circuits having outputs commonly coupled to a same suppression output bitline; and
    a result control circuit that suppresses a match indication result based on a suppression value provided on the suppression output bitline.

2. The CAM device of claim 1, wherein:
    each CAM entry comprising a plurality of CAM cells commonly coupled to a match line.

3. The CAM device of claim 1, wherein:
    the plurality of CAM entries includes at least a first set of CAM entries and a second set of CAM entries; and
    the at least one suppression store circuit includes
        a first suppression data store that stores at least one suppression bit value corresponding to each entry in the first set of CAM entries, and
        a second suppression data store, formed separately from the first suppression data store, that stores at least one suppression bit value corresponding to each entry in the second set of CAM entries.

4. The CAM device of claim 1, wherein:
    the PE circuit includes one output line corresponding to each match indication.

5. The CAM device of claim 1, further including:
    the plurality of CAM entries includes a first CAM array having a plurality of first match lines, and a second CAM array having a plurality of second match lines;
    a result combination circuit that combines match indications from first match lines with match indications from corresponding second match lines to generate combination match indications; and
    the PE circuit prioritizes combination match indications and includes one PE output line corresponding to each combination match indication.

6. The CAM device of claim 1, wherein:
    the PE circuit includes a read-only-memory (ROM) having a plurality of entries, each entry being addressed according to a corresponding PE output line.

7. The CAM device of claim 1, wherein:
    each bit storage circuit is accessible by an address of a CAM entry corresponding to the bit storage circuit.

8. The CAM device of claim 1, wherein:
the result control circuit receives result values from the PE circuit and at least one suppression bit value from the at least one suppression store circuit, and outputs a HIT result value if the at least one suppression bit value has one value and outputs a MISS result value if the at least one suppression bit value has another value.

9. A content addressable memory (CAM) device, comprising:
at least one suppression control circuit that receives a search result value and suppression data as inputs, and outputs the search result value when the suppression data has one value, and outputs a predetermined search result when the suppression data has another value;
a priority encoder section, separate from the at least one suppression control circuit, coupled to receive N match signals that generates the search result value that identifies a winning CAM entry from N CAM entries accessed in a search operation; and
at least one suppression data store that stores a plurality of suppression bits, each corresponding to at least one CAM entry, at least one suppression bit corresponding to the winning CAM entry being output as the suppression data.

10. The CAM device of claim 9, further including:
a first CAM array that includes a first group of CAM entries;
a second CAM array that includes a second group of CAM entries; and
the at least one suppression data store includes
 a first block that stores at least one suppression bit corresponding to each CAM entry of the first group of CAM entries, and
 a second block that stores at least one suppression bit corresponding to each CAM entry of the second group of CAM entries.

11. The CAM device of claim 10, wherein:
the first group of CAM entries includes CAM entries having an even physical address; and
the second group of CAM entries includes CAM entries having an odd physical address.

12. The CAM device of claim 10, wherein:
the first block outputs at least a first result suppression bit value, and
the second block outputs at least a second result suppression bit value; and
the priority encoder section outputs an address value corresponding to the winning CAM entry from the search operation.

13. The CAM device of claim 9, wherein:
the CAM device includes a plurality of CAM entries; and
the priority encoder section includes
 a priority encoder circuit having priority encoder output lines for each CAM entry, and
 a read-only-memory (ROM) having at least one location accessed according to each priority encoder output line; and
at least one bit in the suppression data store is accessed according to each priority encoder output line.

14. The content addressable memory of claim 9, wherein:
the at least one suppression data store further includes a plurality of bit storage circuits having outputs coupled to a single suppression output line.

15. A method of suppressing hit indications in a content addressable memory (CAM) device, comprising the steps of:
storing a hit suppression value for each entry of a CAM device in storage elements separate from a CAM memory cell array that forms the entries of the CAM device, the storage elements being commonly coupled to a same single hit suppression bitline;
prioritizing hit indications generated from a search operation to generate prioritized search results;
accessing the hit suppression values with the prioritized search results; and
generating a single bit hit suppression value that varies according to a hit suppression value accessed by a highest priority search result and outputting the single bit hit suppression value on the single hit suppression bitline.

16. The method of claim 15, wherein:
the storage elements are selected from the group consisting of register circuits and latch circuits.

17. The method of claim 15, further including:
suppressing a hit indication in response to a predetermined hit suppression value.

18. The method of claim 15, further including:
accessing a read only memory (ROM) with the prioritized search results in parallel with the hit suppression values to generate a hit address value for a hit indication.

19. The method of claim 18, further including:
suppressing a hit indication in response to predetermined hit suppression value in combination with at least one bit value of the hit address.

20. The method of claim 15, wherein:
the step of accessing the hit suppression values with the prioritized search results includes
 accessing a first set of hit suppression values with a first set of prioritized search results, and
 accessing a second set of hit suppression values with a second set of prioritized search results.

21. The method of claim 15, further including:
logically combining at least two hit indications together prior to prioritizing such hit indications.

* * * * *